US008043943B2

United States Patent
Maboudian et al.

(10) Patent No.: US 8,043,943 B2
(45) Date of Patent: Oct. 25, 2011

(54) LOW-TEMPERATURE FORMATION OF POLYCRYSTALLINE SEMICONDUCTOR FILMS VIA ENHANCED METAL-INDUCED CRYSTALLIZATION

(75) Inventors: Roya Maboudian, Orinda, CA (US); Frank W. DelRio, Chevy Chase, MD (US); Joanna Lai, Santa Clara, CA (US); Tsu-Jae King Liu, Fremont, CA (US)

(73) Assignee: The Regents of the University of California, Oakland, CA (US)

( * ) Notice: Subject to any disclaimer, the term of this patent is extended or adjusted under 35 U.S.C. 154(b) by 32 days.

(21) Appl. No.: 12/651,036

(22) Filed: Dec. 31, 2009

(65) Prior Publication Data

US 2010/0184276 A1    Jul. 22, 2010

Related U.S. Application Data (63) Continuation of application No. PCT/US2008/071809, filed on Jul. 31, 2008.

(60) Provisional application No. 60/953,117, filed on Jul. 31, 2007.

(51) Int. Cl.
  *H01L 21/20* (2006.01)
(52) U.S. Cl. . 438/486; 438/487; 438/488; 257/E21.133; 257/E21.134; 257/E21.135
(58) Field of Classification Search ... 257/E21.133–135; 438/486–488
  See application file for complete search history.

(56) References Cited

U.S. PATENT DOCUMENTS

| | | |
|---|---|---|
| 6,537,898 B1 | 3/2003 | Lee et al. |
| 7,172,952 B2 | 2/2007 | Chung |
| 7,202,143 B1 | 4/2007 | Naseem et al. |
| 2007/0004185 A1 | 1/2007 | Kakkad |

OTHER PUBLICATIONS

Canali et al. ("Solid-phase epitaxial growth of Si through palladium silicide layers", J. of Applied Physics, vol. 46, No. 7, pp. 2831-2836, 1975).*
Hentzell et al. ("Formation of aluminum silicide between two layers of amorphous silicon", App. Phys. Letters, 50 (14), pp. 933-934, 1987).*
Tu ("Selective growth of metal-rich silicide of near-noble metal", App. Phys. Letters, vol. 27, No. 4, pp. 221-224).*

* cited by examiner

*Primary Examiner* — Charles Garber
*Assistant Examiner* — Yasser Abdelaziez
(74) *Attorney, Agent, or Firm* — John P. O'Banion (57) ABSTRACT

A method for forming polycrystalline semiconductor film from amorphous semiconductor film at reduced temperatures and/or accelerated rates. The inclusion of a small percentage of semiconductor material, such as 2% within the metal layer, reduces the temperatures required for crystallization of the amorphous semiconductor by at least 50° C. in comparison to the use of the metal layer without the small percentage of semiconductor material. During a low temperature isothermal annealing process adjacent Al-2% Si and a-Si films undergo a layer exchange resulting in formation of a continuous polycrystalline silicon film having good physical and electrical properties. Formation of polycrystalline-semiconductor in this manner is suitable for use with low temperature substrates (e.g., glass, plastic) as well as with numerous integrated circuit and MEMs fabrication devices and practices.

37 Claims, 10 Drawing Sheets

LOW-TEMPERATURE FORMATION OF POLYCRYSTALLINE SEMICONDUCTOR FILMS VIA ENHANCED METAL-INDUCED CRYSTALLIZATION

CROSS-REFERENCE TO RELATED APPLICATIONS

This application claims priority from, and is a 35 U.S.C. §111(a) continuation of, PCT international application serial number PCT/US2008/071809, filed on Jul. 31, 2008, incorporated herein by reference in its entirety, which claims priority from U.S. provisional application Ser. No. 60/953,117 filed on Jul. 31, 2007, incorporated herein by reference in its entirety.

This application is also related to PCT International Publication No. WO 2009/018472 published on Feb. 5, 2009, incorporated herein by reference in its entirety.

STATEMENT REGARDING FEDERALLY SPONSORED RESEARCH OR DEVELOPMENT

This invention was made with Government support under Grant No. DMI-0304209 awarded by the National Science Foundation. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to semiconductor processes, and more particularly to formation of polycrystalline semiconductor materials at low temperatures.

2. Description of Related Art

In the manufacture of very large scale integrated circuits, polycrystalline-silicon (poly-Si) films are typically formed directly by low-pressure chemical vapor deposition (LPCVD) at temperatures above 600° C., using silane as the precursor gas. Use of such a high process temperature renders this approach unsuitable for formation of poly-Si films on low-cost glass and plastic substrates and on substrates with completed CMOS integrated circuits. Various other techniques have been attempted, with less than ideal results, toward crystallizing amorphous silicon films without subjecting the material to excessive temperatures for the given application.

Accordingly, a need exists for a method of readily forming polycrystalline semiconductor without subjecting the substrate to high temperatures, or requiring the use of complex processing steps. These needs and others are met within the present invention, which overcomes the deficiencies of previously developed poly formation methods.

BRIEF SUMMARY OF THE INVENTION

The invention is an enhanced method of metal-induced crystallization which enables the formation of polycrystalline semiconductor films even at temperatures at or below 300° C. A significant reduction in the temperature required for metal-induced crystallization of a semiconductor (Si, Ge, $Si_{1-x}Ge_x$, SiC, etc.) film is achieved by incorporating a minor percentage (<10%) by atomic percent of the semiconductor within the metal. It should be noted that material percentages given herein should be read as atomic percent even when only the percent (%) designation is given. The metal is preferably aluminum, or alloys of Al, such as Al-4% Cu-1% Si. It should be appreciated that the solid solubility of Si in Al at temperatures below 500° C. is less than 2 atomic percent, wherein the range of <10%, is more practically a range from about 0.5% to 2%".

In utilizing the inventive method to incorporate Si (2%) into the aluminum film, the temperature required for aluminum-induced crystallization of amorphous silicon is reduced by more than 100° C. Consequently, polycrystalline silicon films can be formed even at temperatures below 300° C., making the process compatible with low-cost glass substrates, plastic substrates and substrates containing complementary metal-oxide-semiconductor (CMOS) integrated circuits. Many applications exist which can benefit from the ability to form polycrystalline semiconductor at reduced temperatures, such as at or below the range from about 300° C. to 350° C. It will also be appreciated that the formation of polycrystalline material by the inventive method is enhanced even at higher temperature regimes, wherein one can lower temperature or achieve more rapid crystallization.

The invention is amenable to being embodied in a number of ways, including but not limited to the following descriptions.

An embodiment of the invention is used in a method for metal-induced crystallization of a semiconductor material during formation of a polycrystalline semiconductor film, the improvement comprising incorporating a small percentage of semiconductor material within the metal used for inducing crystallization. In response to the addition of the semiconductor material the initial crystallization temperature is reduced.

An embodiment of the invention is used in a method for lowering the initial crystallization temperature during metal-induced crystallization of a semiconductor material during formation of a polycrystalline semiconductor film, comprising incorporating a small percentage of the semiconductor material within the metal used for inducing crystallization.

An embodiment of the invention is a method of fabricating a semiconductor film, comprising: (a) incorporating a small percentage of a semiconductor material into a metal material to create a semiconductor-metal composite; and (b) forming a film of the semiconductor material from the semiconductor-metal composite in response to low temperature annealing.

The method may be utilized to form polycrystalline semiconductor material selected from the group of Si, Ge, $Si_{1-x}Ge_x$, $Si_{1-y}C_y$, SiC, and others. The method lowers the temperature required for metal-induced crystallization, such as lowering it by at least approximately 50° C. The small percentage of semiconductor material needed is less than 10 atomic percent, and preferably comprises between 0.5 to 5 atomic percent of semiconductor material, and most preferably about 2 atomic percent. Pulsed excimer laser annealing (ELA) can be utilized separately, or in conjunction with a more conventional isothermal annealing step.

An embodiment of the invention is a method of forming polycrystalline semiconductor films at reduced temperatures, comprising: (a) depositing a metal-semiconductor layer over a substrate; (b) the metal-semiconductor layer comprises a metal into which is incorporated between 0.5 to 5 atomic percent of a semiconductor material; (c) forming an interfacial membrane over the metal-semiconductor layer; (d) depositing an amorphous semiconductor material over the interfacial membrane; and (e) sufficiently annealing the semiconductor material to induce a layer exchange between the metal-semiconductor layer and the amorphous semiconductor layer which crystallizes to form a polycrystalline semiconductor layer. The thickness of the amorphous semiconductor layer should be at least as thick as the metal-semiconductor layer, and preferably at least 1.4 times as thick, to ensure formation of a continuous polycrystalline semiconductor film in response to the annealing.

An embodiment of the invention comprises a polycrystalline film formed according to any of the methods described above.

An embodiment of the invention comprises an amorphous semiconductor film stack composition from which a polycrystalline film is formed, comprising: (a) a metal-semiconductor film comprising a metal into which is incorporated a small percentage, less than 10%, of a semiconductor material; (b) an interfacial membrane over the metal-semiconductor film which provides a partial diffusion barrier; (c) an amorphous semiconductor layer over the interfacial membrane. In response to sufficient annealing of the film stack at temperatures at or below about 300° C. to 350° C. a polycrystalline semiconductor material forms and displaces the metal-semiconductor film.

The present invention provides a number of beneficial aspects which can be implemented either separately or in any desired combination without departing from the present teachings.

An aspect of the invention is a method of forming polycrystalline semiconductor from amorphous semiconductor at reduced temperatures.

Another aspect of the invention is the inclusion of a small percentage of semiconductor material within a metal layer used within an induced crystallization process, such as aluminum-induced crystallization (AIC).

Another aspect of the invention provides a mechanism for forming a polycrystalline layer of Si, Ge, $Si_{1-x}Ge_x$, $Si_{1-y}C_y$, SiC, or other semiconductor materials.

Another aspect of the invention provides a mechanism for forming poly-Si in response to incorporating a small percentage of Si (or other semiconductor) within an Al layer proximal to an amorphous Si layer which is being converted to poly-Si.

Another aspect of the invention is that the formation of the polycrystalline semiconductor can be performed at temperatures of from 50° C. to 150° C. lower than with conventional techniques.

Another aspect of the invention is utilizing a small percentage of semiconductor material which comprises less than 10 atomic percent of said semiconductor material, and more preferably between 0.5 to 5 atomic percent, and most preferably approximately 2 atomic percent.

Another aspect of the invention is to reach crystallization in response to a low temperature isothermal annealing process.

Another aspect of the invention is to provide for crystallization either fully, or partially, in response to a laser annealing process.

Another aspect of the invention is to include a laser annealing process step following conventional isothermal annealing.

A still further aspect of the invention is a method by which polycrystalline semiconductor materials can be produced on low temperature substrates which would be damaged by higher temperature processing.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 8A-8C are transmission electron microscopy (TEM) images of the Al-2% Si/a-Si stack before, during and after annealing, according to an embodiment of the present invention.

DETAILED DESCRIPTION OF THE INVENTION

Referring more specifically to the drawings, for illustrative purposes the present invention is embodied in the apparatus generally shown in FIG. 1 through FIG. 14. It will be appreciated that the apparatus may vary as to configuration and as to details of the parts, and that the method may vary as to the specific steps and sequence, without departing from the basic concepts as disclosed herein.

1. Introduction

The invention provides a method by which the temperature required to form polycrystalline semiconductor films can be reduced to temperatures at or even below 300° C., thus opening many new application areas. Benefits are provided over conventional metal-induced crystallization in response to inclusions of small percentages of semiconductor within the metal material.

Figure 1:
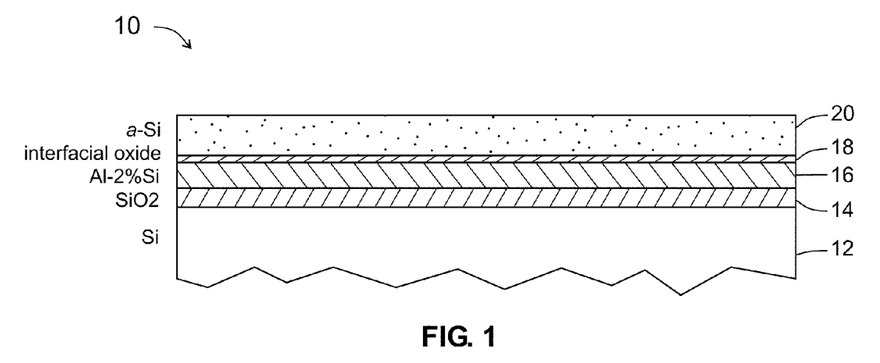
FIG. 1 is a cross-section view of layers being built up according to an embodiment of the present invention in preparation of forming polycrystalline silicon.

FIG. 1 illustrates an embodiment 10 of material layers shown in cross-section which have been deposited preparatory to forming the polycrystalline semiconductor, which by way of example is polycrystalline silicon. In one example the substrate is shown including a barrier layer 14 of $SiO_2$ formed over a Si substrate. A barrier layer is not needed over glass substrates, or similar substrates which already provide a sufficient diffusion barrier.

The substrate 12 (e.g., silicon, glass, plastic and so forth) is preferably loaded into a sputter deposition system (e.g., a Novellus m2i system with base pressure in the range of $10^{-8}$ Torr), which is capable of depositing multiple films without intermediate exposure to the ambient environment. By way of example and not limitation, a metal-semiconductor film 16, exemplified as Al-2% Si, is deposited (typical pressure is 4 mTorr). A practical thickness of the metal-semiconductor layer is within the range of from approximately 5 nm to 10 μm. A preferred thickness range is from approximately 10 nm to 1 μm.

An interfacial membrane is preferably formed to control the crystallization process. This membrane is sufficiently thin so as to allow for metal and semiconductor atoms to diffuse through it at the induced crystallization temperature. Use of this membrane layer has been found to result in achieving a smoother polycrystalline film, as it may prevent grain growth from proceeding upward into the amorphous semiconductor layer. By way of example, the Al-2% Si film is preferably subjected to an oxidizing ambient, for instance at a pressure of 0.5 mTorr for 2 minutes at room temperature to form interfacial oxide layer 18. Maximum thickness of this membrane layer is around 20 nm, with a preferred thickness of less than 10 nm.

Over the interfacial oxide, an amorphous semiconductor 20, such as a-Si, is then deposited, for example using an argon flow rate of 60 sccm. All of these film depositions can be carried out at low temperatures, such as at room temperature (~25° C.), forming the structure shown in FIG. 1 which is prepared for conversion of the amorphous semiconductor material to form the layer of polycrystalline semiconductor.

The thickness of the amorphous semiconductor layer is preferably equal to or greater than about 1.4 times the thickness of the metal-semiconductor layer, wherein the thickness of the amorphous semiconductor layer should be between is 5 nm to 20 μm, with a preferred range from 10 nm to 2 μm.

It should be noted that the amorphous semiconductor layer may comprise doped or undoped semiconductor. By way of example and not limitation, dopants may include phosphorus, arsenic, or boron atoms with dopant concentrations less than or equal to $1E21/cm^{-3}$.

Following film depositions, the substrate can be transferred to another tool to be annealed at a temperature in the range from 250° C. to 500° C. to form a polycrystalline semiconductor film. It should be appreciated that although the method provides the ability to form polycrystalline semiconductor at low temperatures, such as at or below around 300° C. to 350° C., it is also operable at temperatures beyond that range to lower the necessary annealing temperatures and/or annealing times. One preferred method of annealing is to perform a low temperature anneal in which the Al-2% Si/a-Si stack is annealed at 300° C. for approximately two hours. The anneal temperature and concentration of semiconductor in the metal film can be altered from the example described, so as to modify the crystallization rate and the average grain size of the resultant polycrystalline semiconductor film. It will be appreciated that higher anneal temperatures increase the crystallization rate, and result in smaller average grain size. In addition, the Al deposition temperature and oxidation time can be varied to achieve different poly-Si grain structures.

Figure 2:
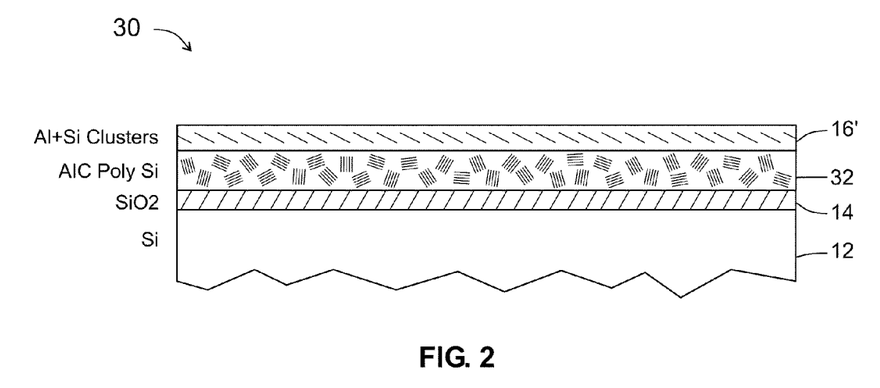
FIG. 2 is a cross-section view of layers within the resultant polycrystalline semiconductor material formed according to an embodiment of the present invention.

FIG. 2 illustrates a cross-section of material 30 which is formed in response to annealing the material layers of FIG. 1. It will be noted that the layer composition and order of FIG. 2 have changed somewhat in relation to FIG. 1; in particular polycrystalline semiconductor (AIC poly-Si) 32 has formed above barrier layer 14 and displaced the metal-semiconductor layer to the top layer which now comprises Al with Si clusters 16'. It should be appreciated that although the final result of the process is described as forming polycrystalline semiconductor (e.g., Si in this example) over a substrate (base) 12; that substrate (base) may comprise any desired substrate material, or any in-process material or device, having suitable characteristics.

Figure 3:
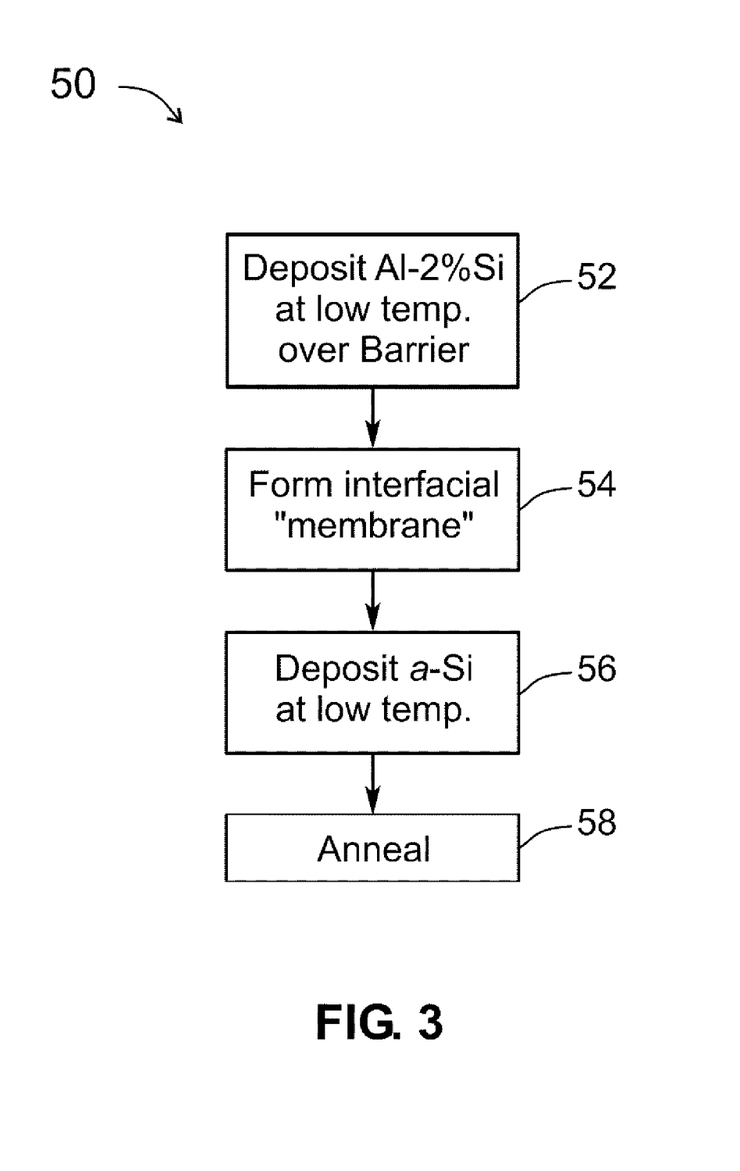
FIG. 3 is a flowchart of a general method of forming polycrystalline semiconductor films at low temperatures according to an embodiment of the present invention.

FIG. 3 summarizes steps in the process 50 of forming the polycrystalline material according to the present invention, for instance at lowered temperatures and/or to enhance the rate of crystallization. A metal layer, which includes a small percentage of semiconductor (e.g., Al-2% Si) is deposited as per block 52 over a substrate configured to prevent diffusion, such as glass, plastic, or a semiconductor material with covering oxide. In block 54 an interfacial membrane, such as a thin oxide layer, is deposited or more preferably formed over the metal layer. A layer of amorphous semiconductor (e.g., a-Si) is then deposited 56 over the membrane. The material, which has been formed at low temperatures, as low as room temperature, is then subjected to an annealing process in block 58. In response to the annealing process polycrystalline semiconductor is formed on the substrate. The following describes additional details about the crystallization process.

It should be recognized that the aluminum-induced crystallization (AIC) of non-hydrogenated amorphous silicon (a-Si) has received a significant amount of attention due to its ability to produce poly-Si films with physical and electrical properties that are suited to a number of different applications. In the present invention, however, the introduction of a small percentage of semiconductor provide unexpected enhancement of crystal formation at low temperatures. The amount of semiconductor that must be present within the metal is less than 10 atomic percent, and preferably in the range of from 0.5 to 5 atomic percent, or most preferably around 2 atomic percent. In response to utilizing Al-2% Si instead of pure Al as the metal layer, this invention capitalizes on all of the benefits of AIC while lowering the initial crystallization temperature.

It should be appreciated that even very small amounts of semiconductor material are sufficient to "seed" the crystallization process, thus reducing initial crystallization temperature. It should also be recognized that the seeding semiconductor within the metal need not be the same type of material as the amorphous material. For example, Ge may be incorporated into the metal layer to lower the induced crystallization temperature for amorphous Si.

Figure 4A:
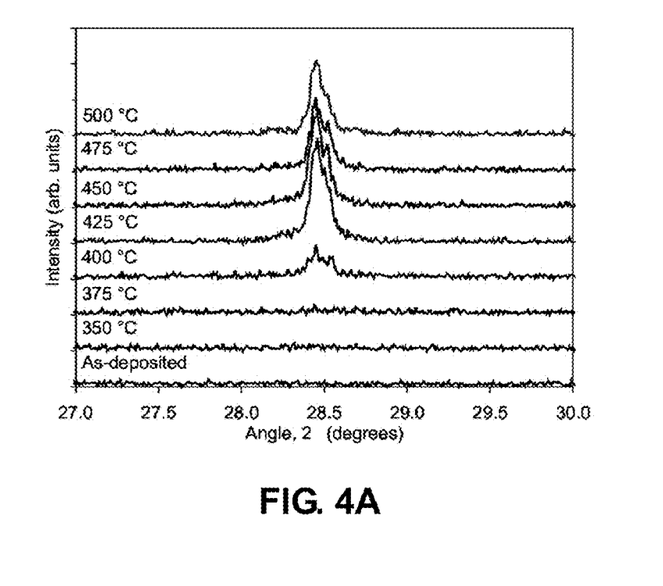
FIG. 4A-4B are graphs of X-ray diffraction (XRD) patterns showing Si (111) peaks when comparing conventional Al/a-Si and Al-2% Si/a-Si according to an aspect of the present invention.
Figure 4B:
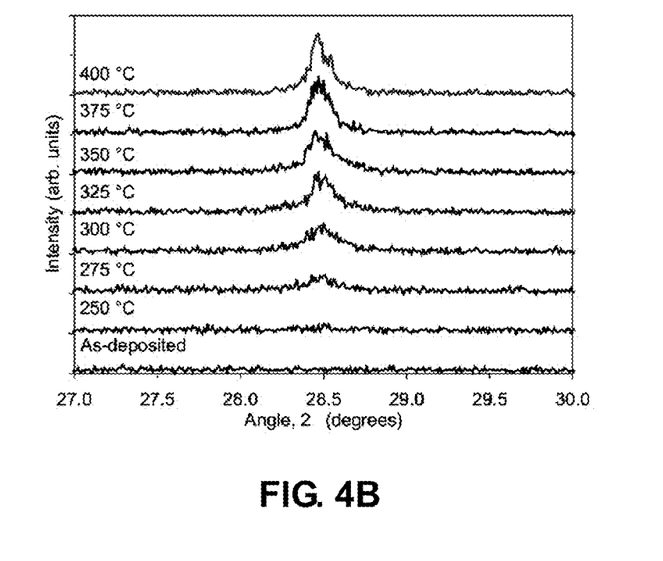

FIG. 4A-4B illustrates this crystallization phenomenon by comparing data obtained from X-ray diffraction (XRD) on Al/a-Si in comparison with Al-2% Si/a-Si samples. The figure shows the growth of the Si (111) peak for Al/a-Si (FIG. 4A) and Al-2% Si/a-Si (FIG. 4B) samples annealed at various temperatures for 60 minutes. For the pure Al sample of FIG. 4A, crystallization initiated at 400° C. and reached completion at 450° C. For the Al-2% Si sample of FIG. 4B, however, crystallization initiated at 275° C. reached completion at 325° C. Accordingly, it should be appreciated that the inventive process of the invention, as shown in this case, offers a 125° C. reduction in the initial crystallization temperature.

2. Forming Polycrystalline Films

Polycrystalline silicon (poly-Si) thin films are used to form transistor gate electrodes in complementary metal-oxide-semiconductor (CMOS) integrated circuits and structural layers in surface-micromachined microelectromechanical systems (MEMS). As described previously, poly-Si films can be conventionally deposited directly by low-pressure, chemical vapor deposition (LPCVD) at high temperatures, such as above 600° C., using silane as the precursor gas. However, such high temperatures limit the type of substrates which can be utilized, and in particular preclude the use of low-cost substrates such as glass and plastic, and the building of MEMS devices, in particular on completed (or partially completed) electronic circuits, especially including CMOS electronics. As a result, a significant amount of attention has been directed towards the formation of poly-Si by solid-phase crystallization (SPC) and excimer-laser annealing (ELA) of amorphous silicon (a-Si). However, SPC is a slow process that can require approximately twenty hours to reach completion even at 600° C., while ELA is generally a higher cost process in relation to traditional forms of annealing.

Aluminum-induced crystallization (AIC) of a-Si is a low temperature alternative to these methods which provides numerous benefits. It will be appreciated that the crystallization temperature of amorphous semiconductor, such as a-Si, is reduced when it is in contact with certain metals. It has been postulated that the reason for this is that mobile free electrons in the metal layer electronically screen the Si covalent bonds. As a result of the screening, the Si covalent bonds become weaker, which lowers the activation energy for silicon dissolution and promotes the transformation from the amorphous phase to the crystalline phase.

The formation of poly-Si by AIC of non-hydrogenated a-Si relies heavily on layer exchange of the adjacent Si and Al films. The layer exchange occurs during isothermal annealing at temperatures well below the eutectic temperature for the Si—Al binary system ($T_{eu}$=577° C.). It has been shown that several factors affect the exchange of the Al and Si layers, and consequently, have an impact on the characteristics of the poly-Si film. These factors include annealing time and temperature, layer ratio and deposition sequence, Al grain structure, and thickness of the oxide at the Al/a-Si interface.

The present invention demonstrates that the presence of Si in the Al film also has a significant influence on the AIC process. In particular, the use of Al-2% Si is exemplified for further lowering the necessary initial crystallization temperature.

3. Tests Performed

To illustrate the advantages of Al-2% Si induced crystallization of a-Si, a series of samples were prepared on 6-inch, (100) p-type silicon substrates. At the start, the substrates were cleaned in piranha solution (H2SO4:H2O2) at 120° C. and hydrofluoric acid. LPCVD was utilized to grow a 2 μm thick SiO2 film, which acts as a diffusion barrier between the Si substrate and the Al-2% Si/a-Si stack.

The wafers were immediately transferred to a Novellus m2i sputtering system (base pressure $10^{-8}$ Torr), which is a modular tool capable of depositing multiple films without intermediate exposure to the ambient environment. Al-2% Si was deposited at a temperature and pressure of 25° C. and 4 mTorr, respectively. In this example, the thickness of the Al-2% Si film was 500 nm. The samples were subjected to an oxygen environment at a pressure of 0.5 mTorr for 2 minutes. The interfacial oxide is configured to act as a membrane between the Al-2% Si and a-Si layers to facilitate a uniform crystallization process. The a-Si was deposited on top of the Al layer at a temperature and pressure of 25° C. and 3.6 mTorr, respectively. The thickness of the a-Si film in this example was 750 nm. It should be noted that the a-Si layer should be at least as thick as the Al layer to ensure a continuous poly-Si film, and more preferably at least 1.4 times thicker.

Following film depositions, the samples were annealed in vacuum (base pressure $10^{-7}$ Torr) at temperatures in the range of 250° C. to 375° C. for approximately 10 to 180 minutes. It should be noted that a new sample was utilized for each subsequent annealing test, wherein the samples were not subjected to multiple temperatures. Using the same processing parameters, samples were also fabricated using pure Al as the metal layer to provide a base for comparison.

4. Results and Discussion

The chemical composition and bonding configuration of the near-surface region were examined utilizing ex-situ X-ray photoelectron spectroscopy (XPS) in an ultra-high vacuum chamber (base pressure $10^{-9}$ Torr) using an Al Kα excitation source (e.g., Omicron DAR 400) and a hemispherical analyzer (e.g., Omicron EA 125). The anode voltage and emission current for the X-ray source were 15 kV and 20 mA, respectively.

Figure 5A:
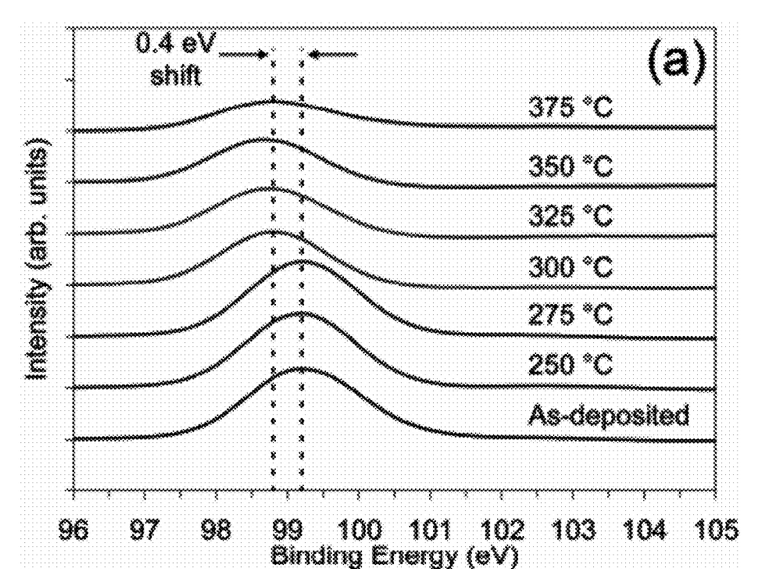
FIG. 5A-5B are graphs of binding energy for $Si_{2p}$ and $Al_{2p}$ regions before and after annealing at various temperatures, according to aspects of the present invention.
Figure 5B:
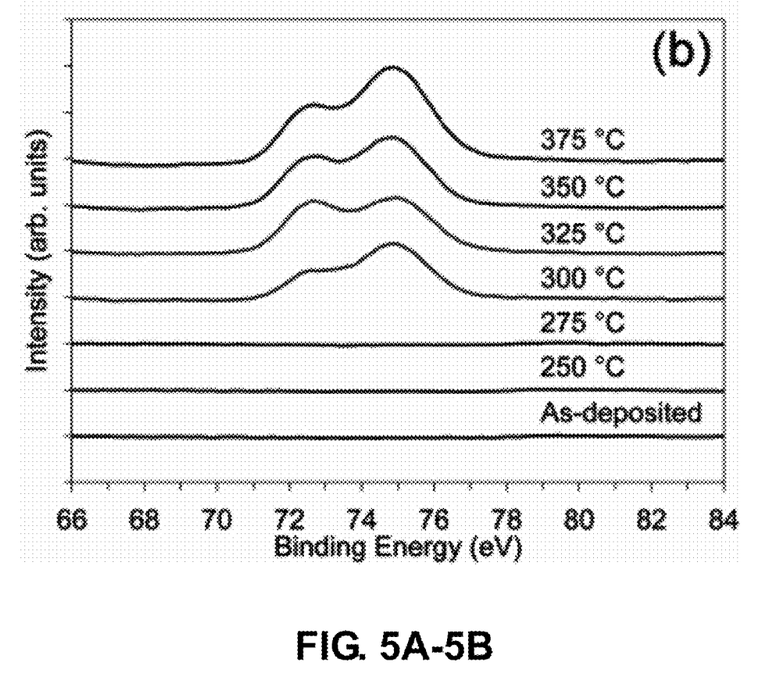

FIGS. 5A and 5B show the $Si_{2p}$ and $Al_{2p}$ regions, respectively, before and after annealing at various temperatures for 60 minutes. In FIG. 5A at temperatures below 300° C. the $Si_{2p}$ peak related to elemental silicon (at 99.2 eV) remains unchanged, while at 300° C., a decrease in the $Si_{2p}$ peak intensity was noted, accompanied by the emergence of two peaks in the $Al_{2p}$ region shown in FIG. 5B. The first peak (at 72.6 eV) corresponds to elemental aluminum, while the second peak (at 74.4 eV) can be attributed to aluminum oxide. Peak areas were used to compute elemental ratios after correcting for the elemental sensitivity factors. The Al/Si ratio increases monotonically from 0.59 to 1.64 as the temperature increases from 300° C. to 375° C., which is indicative of the layer exchange process. In addition, at 300° C. and above, a shift in the $Si_{2p}$ peak is observed from 99.2 to 98.8 eV. A shift in the binding energy of core electrons is directly related to a change in the Fermi level (i.e., change in doping state). The observed decrease in the $Si_{2p}$ binding energy is consistent with p-type doping of the Si layer, attributed to the presence of Al in the crystallized film.

Figures 6A, 6B:
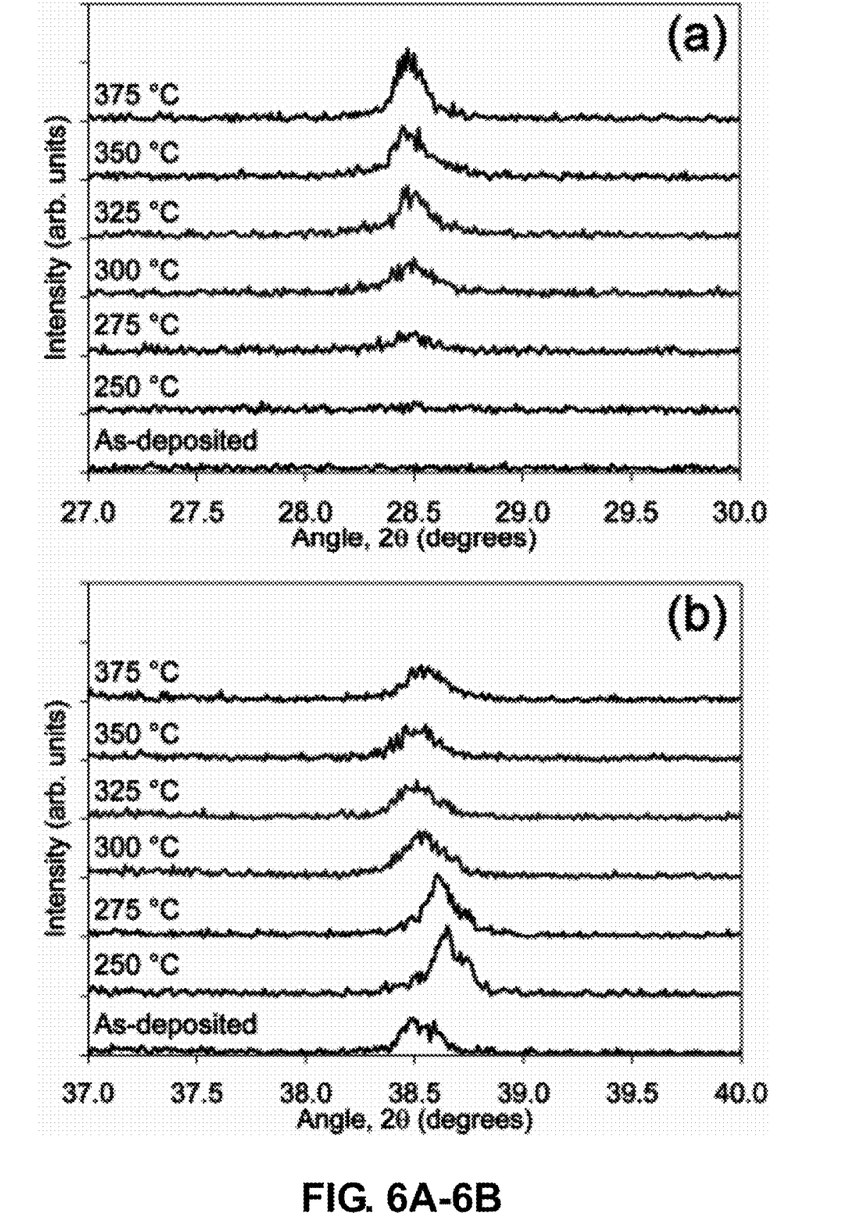
FIG. 6A-6B are graphs of X-ray diffraction intensity versus angle for the Si (111) peak and for the Al (111) peak, respectively.

FIGS. 6A and 6B illustrate XRD intensity versus angle data for the Si (111) peak in FIG. 6A and for the Al (111) peak in FIG. 6B. To monitor the crystallization process, X-ray diffraction (XRD) was performed in an automated powder X-ray diffractometer (e.g., Siemens D5000) with Cu Kα radiation (λ=1.5418 Å) and a graphite monochromator. The accelerating voltage and beam current were 45 kV and 35 mA, respectively. Prior to heat treatment, the XRD spectra were dominated by the Si (400) peak from the Si substrate and the Al (111) peak from the Al layer. Upon crystallization, the Si (111) peak appeared, with weak Si (220) and Si (311) peaks also present. The growth of the Si (111) peak, which is centered at a 2θ value of approximately 28.5°, was monitored before and after annealing at various temperatures for 60 minutes as depicted in FIG. 6A.

The fraction of crystallized material was evaluated at each temperature by comparing the peak area A to the maximum attainable peak area $A_{max}$. At 250° C., the sample does not display any crystallization. The crystallization ratio subsequently increases to $A/A_{max}$=0.41 at 275° C., $A/A_{max}$=0.74 at 300° C., and eventually reaches unity (i.e., maximum crystallization) around 325° C. In addition to the Si (111) peak, the Al (111) peak was examined as shown in FIG. 6B. Prior to any heat treatment, the Al (111) peak is located at a 2θ value of 38.5°. After annealing at 250° C. (and 275° C.), however, the Al (111) peak shifts to a 2θ value of 38.6°. At temperatures above 300° C., the Al (111) peak returns to its original position. The shift may indicate a change in the stress state of the aluminum film. It will be appreciated that a uniform compressive strain perpendicular to the diffraction plane would decrease the equilibrium spacing in each grain and shift the associated diffraction peak to higher angles. Since the shift only occurs at intermediate temperatures, the compressive strain on the aluminum film may be related to the initial stages of the layer exchange process. For the pure Al/a-Si samples, similar measurements revealed that the crystallization initiates at 325° C. and reaches completion at 375° C. for a 60 minute anneal. Thus, the 2% Si enhances the crystallization process, thereby reducing the initial crystallization temperature in this case by approximately 50° C.

Assuming an Arrhenius-type behavior for the crystallization process, the activation energy was calculated according to the relationship $C=C_o e^{-Q/kT}$, where C is the crystallization rate, $C_o$ is the frequency factor, Q is the activation energy, k is the Boltzmann constant, and T is the absolute temperature. Since the area under the diffraction peak is proportional to the amount of crystallized material, the rate of change in the peak area is related to the crystallization rate.

Figure 7:
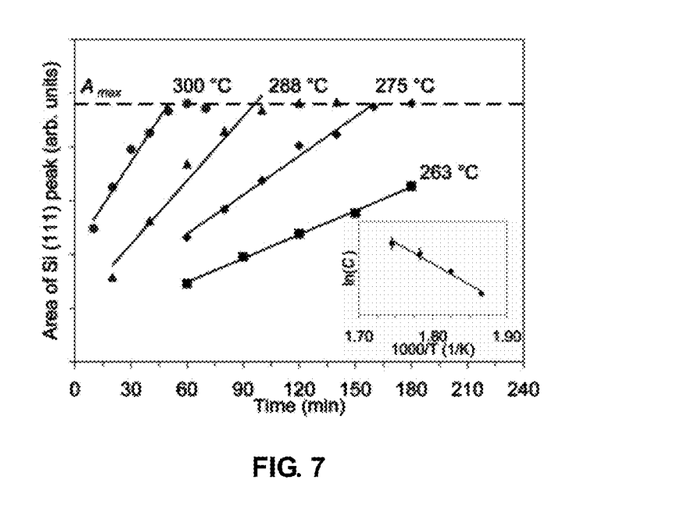
FIG. 7 is a graph of the Si (111) peak area as a function of annealing time at various temperatures.

FIG. 7 illustrates the Si (111) peak area as a function of annealing time at various temperatures. The crystallization rate increases linearly with time prior to saturation at each temperature, with the slope of the line equal to the crystallization rate. By plotting ln(C) versus 1000/T and evaluating the slope, as shown in the inset, the activation energy Q for the process is found to be 0.97±0.09 eV. This value is close to the activation energy for Si diffusion in evaporated Al films (0.79 to 0.90 eV), indicating that this crystallization is a diffusion-limited process.

Figures 8A, 8C:
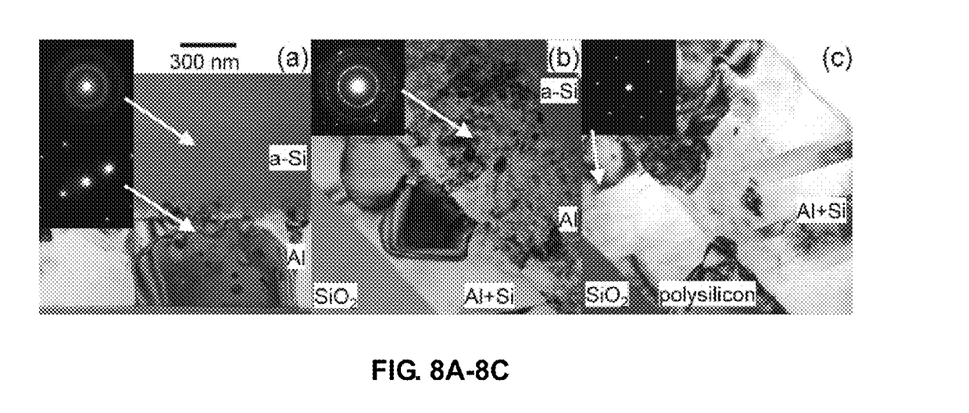

FIG. 8A-8C depict transmission electron micrographs and selective-area electron diffraction patterns of the Al-2% Si/a-Si stack in response to cross-sectional transmission electron microscopy (TEM) conducted with an analytical transmission electron microscope (e.g., JEOL JEM-200CX) at an accelerating voltage of 200 kV. The diffraction patterns were used to identify the composition (e.g., Si or Al) and ordering (e.g., amorphous or crystalline) of the individual layers. It should be noted, however, that the orientation of the specific region does not necessarily represent the overall texture of the film. FIG. 8A depicts the Al-2% Si/a-Si structure prior to any heat treatment. The Al film exhibits a columnar grain structure, with an average grain size of approximately 640 nm. The diffraction pattern for the bottom layer is characteristic of crystalline Al in the (112) orientation, while the diffraction pattern for the top layer is indicative of an amorphous material. After annealing at 275° C. for 60 minutes, the Si and Al layers were in the initial stages of the layer exchange process as shown in FIG. 8B. As a result of the Si nucleation and growth, the Al layer was displaced. The diffraction pattern for the displaced material indicates polycrystalline Al in the (111) orientation. After annealing at 375° C. for 60 minutes, the layer exchange was completed, resulting in a continuous poly-Si film on the bottom (adjacent the substrate) and the displaced Al with some residual Si on the top as depicted in FIG. 8C. The diffraction pattern for a single grain in the bottom layer suggests crystalline Si in the (111) orientation.

As noted above, the inclusion of the 2% Si is found to have a significant impact on the initial crystallization temperature. To provide a plausible explanation for the observed enhancement, it is useful to consider the four main steps in the crystallization process, which include: (1) Si dissolution at the Al-2% Si/a-Si interface, (2) initial Si diffusion in Al, (3) Si nucleation, and (4) Si grain growth via Si diffusion in Al. With regards to step (1), it has been put forth that Si dissolution is due to electronic screening from mobile free electrons in the Al layer. The Si in the Al film does not impact the electronic screening, and consequently, should have little influence on the Si dissolution. With regards to steps (2) and (4), it has been shown that the activation energy for Si diffusion in Al is independent of Si content; the activation energy for Si diffusion is 0.85±0.05 eV for Al-0.4% Si films and 0.90±0.05 eV for Al-0.8% Si and Al-1.8% Si films. Therefore, the Si content in Al should not affect the Si diffusion. In contrast, the presence of Si in the Al film can influence the Si nucleation (step 3). At room temperature, the solid solubility of Si in Al is well below the 2% Si in the film. Consequently, the additional Si precipitates as a second phase. The Si particles in the Al film may act as nucleation sites for Si grain growth, leading to the observed enhancement in the onset of crystallization.

Assuming that this hypothesis is correct, the question then arises as to how the presence of Si in an Al film can enhance the layer exchange and crystallization of an adjacent a-Si film, while it prevents spiking at Al-crystalline silicon (c-Si) contacts during integrated-circuit fabrication. It has been demonstrated that the mechanism for Si dissolution and transport in Al is strongly dependent on the Si doping levels and grain size. For heavily-doped c-Si, which is normally encountered during integrated circuit fabrication, the diffusion of Si in Al is governed by the solubility limit. Therefore, by pre-satisfying the solubility requirement through the addition of Si to the Al layer, it becomes possible to prevent c-Si contact dissolution and junction spiking.

For a-Si, which is pertinent to the AIC process, the high degree of disorder in the a-Si film promotes dissolution and grain growth into the Al layer. The transport of Si into Al is energetically favorable, and not governed by solid solubility. Thus, the layer exchange process can be enhanced (rather than suppressed) by increasing the grain seeding rate through the addition of Si to the Al layer.

In summary an implementation of the invention describing Al-2% Si induced crystallization of amorphous silicon was tested. As with the Al/a-Si system, adjacent Al-2% Si and a-Si films were found to undergo a layer exchange through a diffusion-limited process, resulting in a continuous poly-Si film with beneficial physical and electrical properties that are suitable for many integrated circuit applications. The inclusion of the 2% Si in the metal layer was found to enhance the crystallization process, thereby reducing the initial crystallization temperature, such as by at least 50° C. The enhancement was attributed to the presence of Si precipitates in the Al-2% Si film, which act as nucleation sites for Si grain growth.

5. Mechanical Properties Of Polycrystalline Silicon

This section describes mechanical properties of the polycrystalline silicon (poly-Si) formed by the inventive Al-2% Si induced crystallization method. Due to their low thermal process budget, poly-Si films formed by Al-2% Si induced crystallization (AIC) are potentially attractive for monolithic integration of MEMS with CMOS electronics using a "MEMS-last" process flow. In this work, the mechanical properties of AIC poly-Si films formed with a maximum substrate temperature of 350° C. are investigated. Residual stress ($\sigma$), Young's modulus (E), and strain gradient ($\Gamma$) are extracted from pull-in voltage measurements of cantilever and clamped-clamped beams.

In one embodiment of the present invention, a post-AIC pulsed excimer laser annealing (ELA) treatment provides a beneficial means for completing the Al-2% Si and Si layer exchange process, although it results in a larger strain gradient within the poly-Si layer. The mechanical properties of AIC poly-Si films ($\sigma$=6.0 MPa, E=134 GPa, and $\Gamma$=–2.0E-4 $\mu m^{-1}$ with ELA) compare favorably with those of low-thermal-budget poly-$Si_{0.4}Ge_{0.6}$ films, so that AIC poly-Si is a promising structural material for MEMS.

In the following sections the mechanical aspects of the polycrystalline material are considered in more detail.

6. Low-Thermal-Budget Forming Of Polycrystalline Silicon Films

Following is a discussion of an Al-2% Si induced crystallization process according to another example embodiment of the present invention. A Novellus M2i DC magnetron sputter deposition system (base pressure of approximately $10^{-7}$ Torr) was used to deposit and anneal thin-film stacks of Al-2% Si and a-Si layers, without breaking vacuum, to form poly-Si films as follows. Oxidized silicon wafers (with 300 nm-thick $SiO_2$) were used as the starting substrate. First, a 500 nm-thick Al-2% Si layer was deposited at a temperature and pressure of 25° C. and 4 mT, respectively. The Al-2% Si film was then exposed to oxygen for 2 minutes at 25° C. and 2 mT to form a thin interfacial oxide for the AIC process. A 750 nm-thick a-Si film was then deposited at 25° C., 3.6 mT.

Figure 9A:
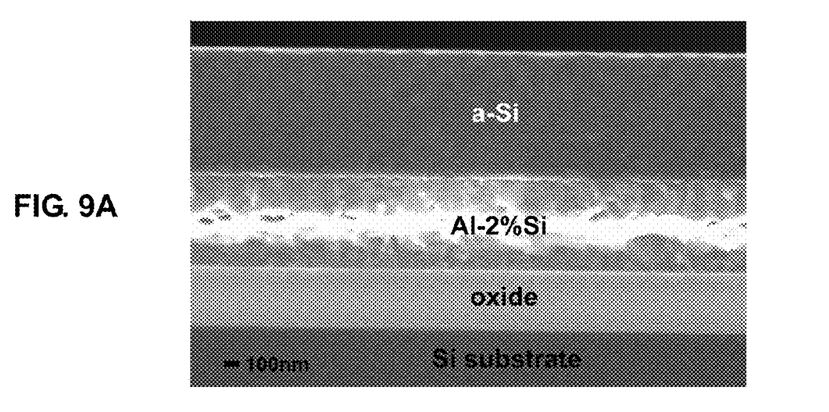
FIG. 9A-9C are scanning electron micrographs (SEM) of film stacks according to the present invention, before, during and after annealing, according to an embodiment of the present invention.
Figure 9B:
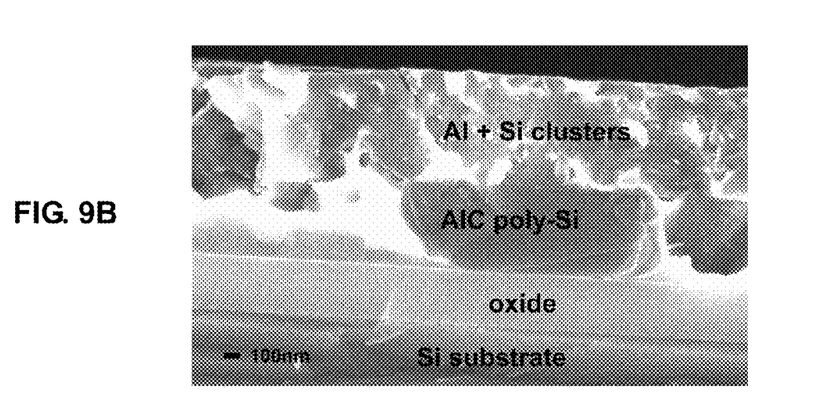
Figure 9C:
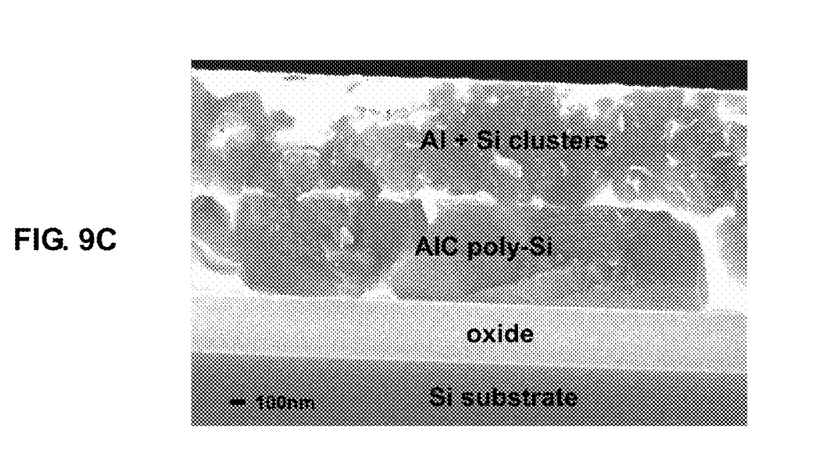

FIG. 9A through FIG. 9C depict cross-sectional scanning electron micrographs (SEM) of film stacks according to the present invention. An as-deposited film stack is shown in FIG. 9A. The Al-2% Si/a-Si thin-film stack is then annealed in vacuum (~$10^{-7}$ T) at 350° C. for 3 hours. During this anneal, the Si displaces the Al, resulting in a 500 nm-thick poly-Si layer on the bottom and an Al layer with embedded Si clusters on the top, as shown in FIG. 9B. It should be noted that the thin interfacial oxide layer ensures a uniform poly-Si layer thickness. It is apparent from FIG. 9B, however, that the layer exchange process is not yet completed. Thus, selected samples received an additional pulsed (e.g., 30 nm) excimer laser anneal (ELA). The ELA (e.g., at 308 nm wavelength) was performed with 3 shots at a fluence of 100 $mJ/cm^2$ to drive the layer-exchange process to completion, as shown in FIG. 9C. Finally, the top layer of Al was selectively removed with a wet Al etchant.

AIC poly-Si films are conductive due to the incorporation of Al, which is an acceptor-type impurity, at the solid solubility limit. Researchers have performed Hall-effect measurements at room temperature to determine the mobile carrier concentration and resistivity for poly-Si films formed by AIC at 500° C., wherein the hole concentration and resistivity ($\rho$) were found to be approximately $2.6 \times 10^{18}$ $cm^{-3}$ and 0.041 $\Omega$-cm, respectively. The resistivities of the AIC poly-Si films studied in this work were extracted from four-point probe measurements, to be 0.176 $\Omega$-cm and 0.172 $\Omega$-cm for films formed with and without an ELA treatment, respectively. These higher resistivity values are likely due to lower hole concentrations because of the lower solid solubility of Al in Si at 350° C.

7. X-Ray Diffraction Analyses

An X-ray diffraction (XRD) analyses was performed on annealed samples before and after the removal of the top Al layer, using a Siemens D-5000 X-ray diffractometer with Cu K$\alpha$ radiation ($\lambda$=1.5418 Å). The anode voltage and emission current for the X-ray source were 40 kV and 30 mA, respectively.

Figure 10:
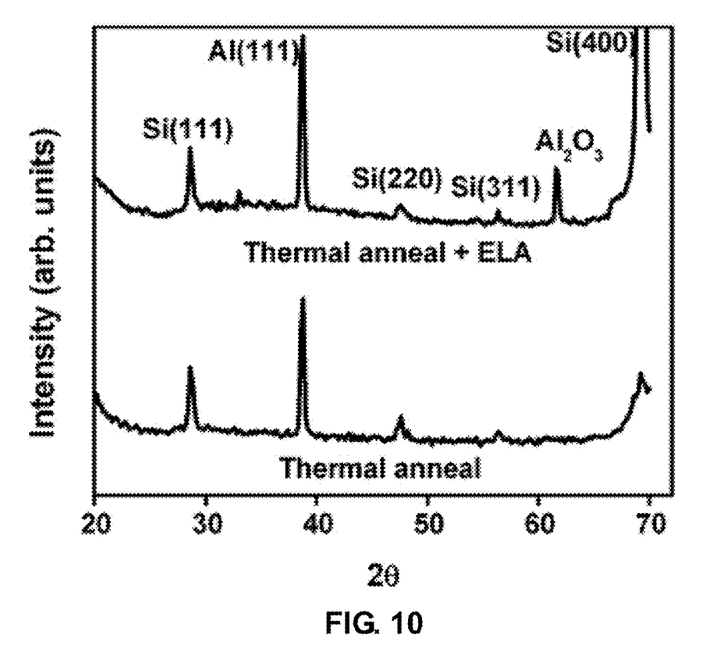
FIG. 10 is a graph of 2θ scans for samples prior to removal of the top Al layer which compares non-ELA treated samples (lower curve), with ELA treated samples (upper curve), according to an aspect of the present invention.

FIG. 10 depicts the 2$\theta$ scans for samples prior to removal of the top Al layer. The lower curve is for a sample which did not receive an ELA treatment; the upper curve is for a sample which received an additional ELA treatment. A strong Si(400) peak is observed due to the substrate, and a large Al(111) peak is observed due to the top Al layer. The Si(111) peak is due to the bottom poly-Si layer, as are the weaker Si(220) and Si(311) peaks. An additional peak at 61.6° is seen for the sample which received an ELA treatment, which can be attributed to $Al_2O_3$(018) or $Al_2O_3$(122). This indicates that polycrystalline alumina is formed during the ELA treatment, which is performed in (oxygen-containing) ambient air.

Figure 11:
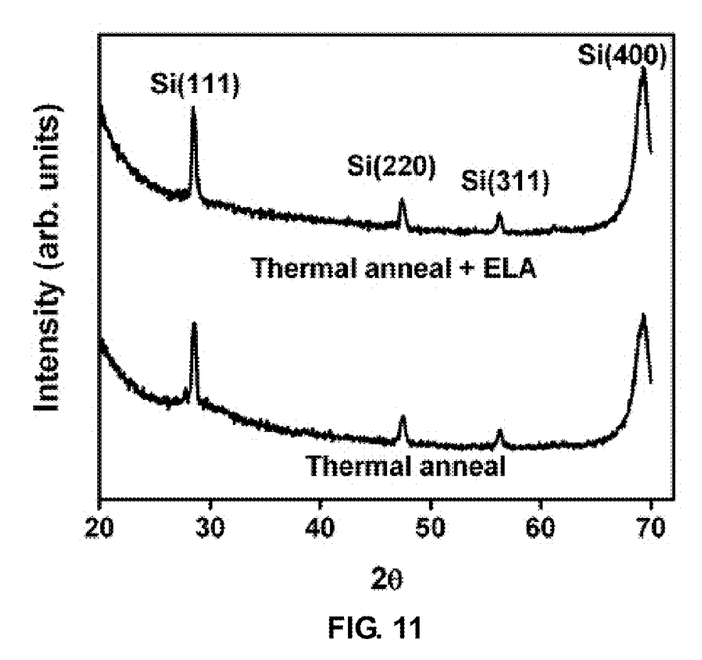
FIG. 11 is a graph of 2θ scans for samples after removal of the top Al layer which compares non-ELA treated samples (lower curve), with ELA treated samples (upper curve), according to an aspect of the present invention.

FIG. 11 shows the 2$\theta$ scans for samples after removal of the top Al layer. The lower curve is for a sample which did not receive an ELA treatment, while the upper curve is for a sample which received an ELA treatment. The crystalline Al and $Al_2O_3$ peaks are no longer present, whereas the poly-Si peaks remain, as expected. The texture of the poly-Si films can be determined from the fractional volumes of the (111), (220) and (311) peaks. Although the (110) texture cannot be measured directly due to the lack of crystal symmetry, it can be deduced from the (220) peak. The (100) texture of the poly-Si films cannot be determined due to the large Si(400) peak from the substrate. The (111):(220):(311) area ratio for AIC poly-Si films formed without ELA treatment is 1:0.38:0.20. For films formed with an ELA treatment, the area ratio is almost unchanged at 1:0.39:0.21. With the normalization factors of 1, 0.38 and 0.19 for the (111), (220) and (311) peaks, respectively, the fractional volumes of the three textures are approximately equal, indicating no dominant grain orientation. By comparison, researchers have shown that poly-Si films formed by solid phase crystallization (SPC) and ELA have strong (111) texture when the films have large crystallites, such as when the average grain size is much greater than the film thickness, as is the case for poly-Si formed by AIC. Both studies also showed that films with smaller crystallites have no preferred grain orientation.

8. Device Fabrication

A single-mask process was used to fabricate two-terminal switches on heavily n-type doped Si (100) wafer substrates with 150 nm-thick $SiO_2$ as the sacrificial layer and 500 nm-thick AIC poly-Si as the structural layer. The AIC poly-Si films were patterned to form cantilever beams and clamped-clamped beams of various lengths, using conventional photolithography and dry etching processes.

Figure 12:
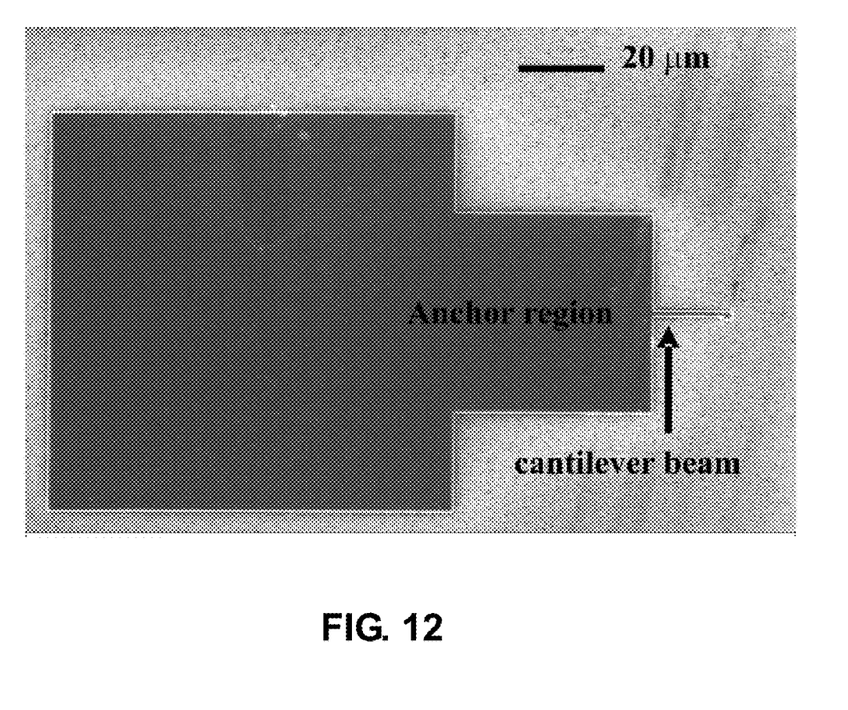
FIG. 12 is a SEM image of a MEMs device fabricated according to an aspect of the present invention.

FIG. 12 is a SEM image of a fabricated MEMs device from which extends a beam 1 $\mu$m wide and 20 $\mu$m long beam from the right of the figures from the anchor region. For perspective reference a 20 $\mu$m scale bar is depicted in the upper right corner of the figure. The beams were released using a timed (15-minute) HF vapor etch. Due to the relatively thin structural and sacrificial layer thicknesses, optical interferometry could not be used to determine the strain gradient. Instead, pull-in voltage ($V_{PI}$) measurements for 1 $\mu$m-wide beams of various lengths were used to extract the mechanical properties of the AIC poly-Si films. This was accomplished using analytical models for $V_{PI}$ which include the effect of strain gradient ($\Gamma$) for cantilever beams and the effect of residual stress ($\sigma$) for clamped-clamped beams in the Euler-Bernoulli beam equations, as described in the following section.

9. Aic Poly-Si Mechanical Properties

Residual stress and non-zero strain gradient can each adversely affect the operation of MEMS devices. Clamped-clamped beams with high compressive stress can buckle upon release, whereas beams with high tensile stress can fracture. Ideally, residual stress should be zero, or slightly tensile (<100 MPa), to avoid any significant effect on the elastic spring constant of a beam. A strain gradient (change in stress through the thickness of the beam) can result in significant out-of-plane deflection which should be minimized. At best this out-of-plane deflection adversely affects beam actuation voltage, while often the deflection renders devices wholly inoperable.

Figure 13:
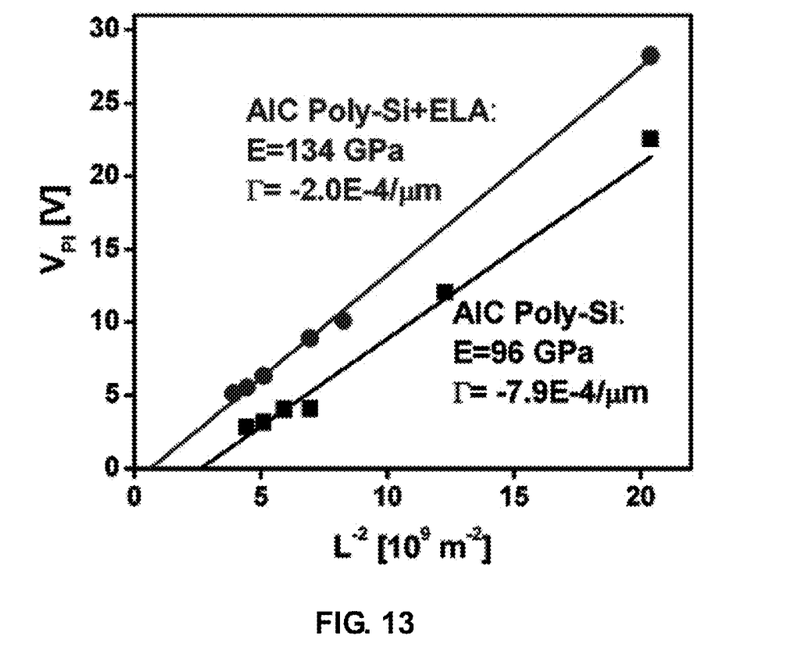
FIG. 13 is a graph of measured values of $V_{PI}$ plotted as a function of cantilever beam length (L) for the polycrystalline material formed according to aspects of the present invention.

FIG. 13 depicts measured values of $V_{PI}$ which were plotted as a function of cantilever beam length (L), so as to allow for extraction of the Young's modulus (E) and strain gradient of the AIC poly-Si beam material. From simple beam theory (not accounting for the presence of a strain gradient), $V_{PI}$ is proportional to $1/L^2$:

$$V_{PI} = \sqrt{\frac{8Eh^3g^3}{27\varepsilon_0 L^4}} \quad (1)$$

where h is the thickness of the beam (500 nm), g is the thickness of the air gap (150 nm), and $\epsilon_o$ is the vacuum permittivity. From the slope of the $V_{PI}$ versus $1/L^2$ plot in FIG. 13, it can be seen that the Young's modulus of AIC poly-Si formed without an ELA treatment is lower than that for AIC poly-Si formed with an ELA treatment, consistent with expectations based on FIG. 9B and FIG. 9C. Following the methodology of P. M. Osterberg and S. D. Senturia (Journal of Microelectromech. Systems 6, 2 (1997)), the value of Young's modulus is determined to be about 134 GPa for the AIC poly-Si with ELA treatment, which falls within the range for monocrystalline silicon. This confirms that the additional ELA treatment completes the layer-exchange process.

Accounting for a non-zero strain gradient $\Gamma$, $V_{PI}$ for a cantilever beam is given by the following equation:

$$V_{PI} = 1.2965\sqrt{\frac{2EIg^3}{\varepsilon_0 WL^4}} + 0.64825\Gamma\sqrt{\frac{2EIg}{\varepsilon_0 W}} \quad (2)$$

where $I=h^3W/12$ is the area moment of inertia. The extracted $\Gamma$ values are shown in FIG. 13. The AIC poly-Si film formed without an ELA treatment exhibits large, negative strain gradient ($-7.9\text{E}-4\ \mu m^{-1}$) and low Young's modulus (which is generally undesirable) because of incomplete layer exchange during the crystallization process. The AIC poly-Si film formed with an ELA treatment exhibits a less negative strain gradient ($-2.0\text{E}-4\ \mu m^{-1}$), since the partial melting and recrystallization which occurs during the ELA process results in tensile strain in the surface region. Although this strain gradient is still larger than that of a high-temperature-deposited poly-Si film ($\Gamma_{Si}=-2.25\text{E}-5\ \mu m^{-1}$) of comparable thickness, it is smaller than that of a low-temperature-deposited poly-$Si_{0.4}Ge_{0.6}$ film ($\Gamma_{SiGe}=3.74\text{E}-4\ \mu m^{-1}$) of comparable thickness formed in our laboratory.

Figure 14:
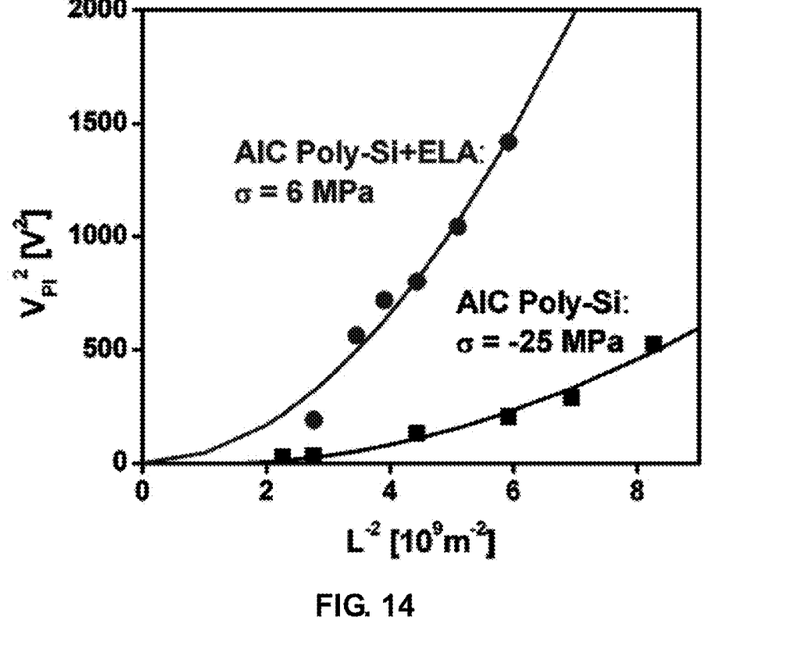
FIG. 14 is a graph of pull-in voltage measurements for clamped-clamped beams of polycrystalline material formed according to aspects of the present invention.

Residual stress affects the pull-in voltage of a clamped-clamped beam according to the following equation:

$$V_{PI} = \sqrt{3.567\frac{\sigma hg^3}{\varepsilon_0 L^2} + 11.70\frac{Eh^3g^3}{\varepsilon_0 L^4}} \quad (3)$$

FIG. 14 depicts pull-in voltage measurements of clamped-clamped beams of various lengths. Residual stress ($\sigma$) is extracted from the fitted curves based on the analytical model extracted from a plot of $(V_{PI})^2$ versus $1/L^2$. The AIC poly-Si film formed without an ELA treatment exhibits low compressive stress ($-25$ MPa). An additional ELA treatment causes the film to become slightly tensile on average (6.0 MPa).

In summary, AIC poly-Si is a promising low-thermal-budget structural material for MEMS integration with CMOS electronics. An AIC poly-Si film formed with a maximum substrate temperature of 350° C. exhibits large strain gradient ($\Gamma=-7.9\text{E}-4\ \mu m^{-1}$), low compressive stress ($\sigma=-25$ MPa) and low Young's modulus (E=96 GPa) due to incomplete layer exchange during the AIC process. An additional ELA treatment is found to be effective for completing the crystallization process, resulting in a poly-Si film with Young's modulus (E=134 GPa) closer to that of high-temperature-processed poly-Si, moderate strain gradient ($\Gamma=-2.0\text{E}-4\ \mu m^{-1}$), and very low tensile stress ($\sigma=6.0$ MPa).

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. In a method for metal-induced crystallization of a semiconductor material during formation of a polycrystalline semiconductor film, the improvement comprising:
   incorporating a small percentage, between 0.5 to 5 percent, of said semiconductor material within the metal used for inducing crystallization;
   wherein an initial crystallization temperature is reduced.

2. A method for lowering the initial crystallization temperature during metal-induced crystallization of a semiconductor material during formation of a semiconductor film, comprising:
   incorporating a small percentage of the semiconductor material, between 0.5 to 5 percent, within the metal used for inducing crystallization.

3. A method of fabricating a semiconductor film, comprising:
incorporating a small percentage of a semiconductor material, between 0.5 to 5 percent, into a metal material to create a semiconductor-metal composite; and
forming a film of said semiconductor material from said semiconductor-metal composite.

4. A method as recited in any of claims 1 through 3, wherein said semiconductor material is selected from the group consisting essentially of Si, Ge, $Si_{1-x}Ge_x$, $Si_{1-y}C_y$, and SiC.

5. A method as recited in any of claims 1 through 3, wherein the temperature required for metal-induced crystallization is lowered by at least approximately 50° C.

6. A method as recited in any of claims 1 through 3:
wherein said metal comprises aluminum;
wherein said semiconductor material comprises amorphous silicon; and
wherein aluminum-induced crystallization of said amorphous silicon is reduced by at least approximately 100° C. by incorporating approximately 2% Si into said aluminum.

7. A method as recited in any of claims 1 through 3, wherein polycrystalline silicon films are formed at temperatures at or below the range of approximately 300° C. to 350° C.

8. A method as recited in any of claims 1 through 3, further comprising pulsed excimer laser annealing (ELA) comprising all or a portion of an annealing step wherein said amorphous semiconductor film is crystallized during metal-induced crystallization.

9. A method of forming polycrystalline semiconductor films, comprising:
depositing a metal-semiconductor layer over a substrate;
said metal-semiconductor layer comprises a metal into which is incorporated between 0.5 to 5 percent of a semiconductor material;
forming an interfacial membrane over said metal-semiconductor layer;
depositing an amorphous semiconductor material over said interfacial membrane; and
sufficiently annealing said semiconductor material to induce a layer exchange between said metal-semiconductor layer and said amorphous semiconductor layer which crystallizes to form a polycrystalline semiconductor layer.

10. A method as recited in claim 9, wherein the thickness of the amorphous semiconductor layer should be at least as thick as the metal-semiconductor layer to ensure formation of a continuous polycrystalline semiconductor film in response to said annealing.

11. A method as recited in claim 9, wherein the thickness of the amorphous semiconductor layer should be at least 1.4 times as thick as the metal-semiconductor layer to ensure formation of a continuous polycrystalline semiconductor film in response to said annealing.

12. A method as recited in claim 9, wherein said semiconductor material comprises less than 10% of the metal-semiconductor layer.

13. A method as recited in claim 9, wherein said semiconductor material comprises from 0.5% to 5% of the metal-semiconductor layer.

14. A method as recited in claim 9, wherein said semiconductor material comprises approximately 2% of the metal-semiconductor layer.

15. A method as recited in claim 9, wherein the resultant polycrystalline semiconductor film is conductive due to the incorporation of some metal from said metal-semiconductor layer.

16. A method as recited in claim 9, wherein said reduced temperatures comprise temperatures at or below a range of approximately 300° C. to 350° C.

17. A method as recited in claim 9, wherein said sufficient annealing comprises isothermal annealing in the range from approximately 300° C. to 350°.

18. A method as recited in claim 9, wherein said sufficient annealing comprises isothermal annealing for approximately one to three hours.

19. A method as recited in claim 9, further comprising pulsed excimer laser annealing (ELA) comprising all or a portion of said annealing step wherein said amorphous semiconductor film is crystallized.

20. A method as recited in claim 19, wherein said laser annealing is utilized for completing the annealing process.

21. A method as recited in claim 9, wherein said metal comprises Aluminum.

22. A method as recited in claim 9, wherein said semiconductor is selected from the group of semiconductor materials consisting of Si, Ge, $Si_{1-x}Ge_x$, $Si_{1-y}C_y$, and SiC.

23. A method as recited in claim 9, wherein said semiconductor material comprises silicon.

24. A method as recited in claim 9, wherein said semiconductor material comprises polycrystalline-silicon-germanium (poly-$Si_{1-x}Ge_x$, 0<×1).

25. A method as recited in claim 9, wherein said method is suitable for forming polycrystalline semiconductor films on substrates which would be damaged by high temperatures exceeding the range of approximately 300° C. to 350° C.

26. A method as recited in claim 9, wherein said method is suitable for forming polycrystalline semiconductor films on glass substrates, plastic substrates and/or substrates containing completed CMOS circuitry.

27. A method as recited in claim 9, wherein said method can be applied using the same equipment as is utilized to perform aluminum-induced crystallization (AIC).

28. A method as recited in claim 9, wherein said polycrystalline semiconductor comprises transistor gate electrodes in complementary metal-oxide-semiconductor (CMOS) integrated circuits.

29. A method as recited in claim 9, wherein said polycrystalline semiconductor comprises structural layers in surface-micromachined microelectromechanical systems (MEMS).

30. A method as recited in claim 9, wherein said polycrystalline semiconductor is utilized in CMOS electronics according to a MEMS-last process flow.

31. In a method for metal-induced crystallization of a semiconductor material during formation of a polycrystalline semiconductor film, the improvement comprising:
incorporating a small percentage of the semiconductor material within the metal used for inducing crystallization;
wherein an initial crystallization temperature is reduced;
wherein said metal comprises aluminum;
wherein said semiconductor material comprises amorphous silicon; and
wherein aluminum-induced crystallization of said amorphous silicon is reduced by at least approximately 100° C. by incorporating approximately 2% Si into said aluminum.

32. A method for lowering the initial crystallization temperature during metal-induced crystallization of a semiconductor material during formation of a semiconductor film, comprising:
incorporating a small percentage of the semiconductor material within the metal used for inducing crystallization;

wherein said metal comprises aluminum;
wherein said semiconductor material comprises amorphous silicon; and
wherein aluminum-induced crystallization of said amorphous silicon is reduced by at least approximately 100° C. by incorporating approximately 2% Si into said aluminum.

33. A method of fabricating a semiconductor film, comprising:
incorporating a small percentage of a semiconductor material into a metal material to create a semiconductor-metal composite; and
forming a film of said semiconductor material from said semiconductor-metal composite;
wherein said metal comprises aluminum;
wherein said semiconductor material comprises amorphous silicon; and
wherein aluminum-induced crystallization of said amorphous silicon is reduced by at least approximately 100° C. by incorporating approximately 2% Si into said aluminum.

34. A method as recited in any of claims 31 through 33, wherein said semiconductor material is selected from the group consisting essentially of Si, Ge, $Si_{1-x}Ge_x$, $Si_{1-y}C_y$, and SiC.

35. A method as recited in any of claims 31 through 33, wherein the temperature required for metal-induced crystallization is lowered by at least approximately 50° C.

36. A method as recited in any of claims 31 through 33, wherein polycrystalline silicon films are formed at temperatures at or below the range of approximately 300° C. to 350° C.

37. A method as recited in any of claims 31 through 33, further comprising pulsed excimer laser annealing (ELA) comprising all or a portion of an annealing step wherein said amorphous semiconductor film is crystallized during metal-induced crystallization.

* * * * *